(12) United States Patent
Quitoriano et al.

(10) Patent No.: US 8,569,900 B2
(45) Date of Patent: Oct. 29, 2013

(54) NANOWIRE SENSOR WITH ANGLED SEGMENTS THAT ARE DIFFERENTLY FUNCTIONALIZED

(75) Inventors: Nathaniel J. Quitoriano, Pacifica, CA (US); Theodore I. Kamins, Palo Alto, CA (US); Hans S. Cho, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/383,183

(22) PCT Filed: Jul. 20, 2009

(86) PCT No.: PCT/US2009/051134
§ 371 (c)(1),
(2), (4) Date: Jan. 9, 2012

(87) PCT Pub. No.: WO2011/010988
PCT Pub. Date: Jan. 27, 2011

(65) Prior Publication Data
US 2012/0112157 A1      May 10, 2012

(51) Int. Cl.
*H01L 23/58* (2006.01)
(52) U.S. Cl.
USPC .......... 257/798; 257/9; 257/E29.07; 977/762; 977/765
(58) Field of Classification Search
USPC ................. 257/9, 798, E29.07; 977/762, 765
See application file for complete search history.

(56) References Cited

U.S. PATENT DOCUMENTS

| | | | |
|---|---|---|---|
| 6,882,051 B2 * | 4/2005 | Majumdar et al. | 257/746 |
| 6,996,147 B2 | 2/2006 | Majumdar et al. | |
| 7,087,920 B1 | 8/2006 | Kamins | |
| 7,105,052 B1 * | 9/2006 | Schlenoff | 117/68 |
| 7,132,677 B2 * | 11/2006 | Kim et al. | 257/14 |
| 7,326,605 B2 * | 2/2008 | Choi et al. | 438/197 |
| 7,501,636 B1 | 3/2009 | Son et al. | |
| 7,544,546 B2 * | 6/2009 | Afzali-Ardakani et al. | 438/142 |
| 7,709,243 B2 * | 5/2010 | Park et al. | 435/283.1 |
| 7,741,647 B2 * | 6/2010 | Wang et al. | 257/81 |
| 7,791,108 B2 * | 9/2010 | Hurkx et al. | 257/198 |
| 7,825,032 B2 * | 11/2010 | Bakkers et al. | 438/707 |
| 7,857,959 B2 * | 12/2010 | Fourkas et al. | 205/118 |
| 7,859,036 B2 * | 12/2010 | Liu et al. | 257/296 |
| 8,034,315 B2 * | 10/2011 | Sinha et al. | 423/447.1 |
| 8,222,127 B2 * | 7/2012 | Marsh et al. | 438/507 |
| 8,333,948 B2 * | 12/2012 | Pak et al. | 423/447.3 |
| 2002/0175408 A1 | 11/2002 | Majumdar et al. | |

(Continued)

FOREIGN PATENT DOCUMENTS

WO     WO-02-080280      10/2002

OTHER PUBLICATIONS

Costa-Kramer, J.L. et al., "Conductance Quantization in Nanonwires Formed Between Micro and Macroscopic Metallic Electrodes", vol. 55, No. 8, Feb. 1997.

(Continued)

*Primary Examiner* — Ida M Soward

(57) ABSTRACT

A nanowire device includes a nanowire having differently functionalized segments. Each of the segments is configured to interact with a species to modulate the conductance of a segment. The nanowire is grown from a single catalyst and the segments include a first segment at a non-linear angle from a second segment.

19 Claims, 7 Drawing Sheets

(56) References Cited

U.S. PATENT DOCUMENTS

| | | |
|---|---|---|
| 2004/0026684 A1 | 2/2004 | Empedocles |
| 2004/0079278 A1 | 4/2004 | Kamins et al. |
| 2004/0082178 A1 | 4/2004 | Kamins et al. |
| 2004/0127012 A1 | 7/2004 | Jin |
| 2004/0150311 A1 | 8/2004 | Jin |
| 2005/0054004 A1 | 3/2005 | Alivasatos et al. |
| 2005/0161662 A1 | 7/2005 | Majumdar et al. |
| 2005/0255491 A1 | 11/2005 | Lee et al. |
| 2006/0087344 A1 | 4/2006 | Snider et al. |
| 2006/0138575 A1 | 6/2006 | Kamins |
| 2006/0204738 A1 | 9/2006 | Dubrow et al. |
| 2006/0207647 A1* | 9/2006 | Tsakalakos et al. .......... 136/256 |
| 2007/0117256 A1 | 5/2007 | Stewart et al. |
| 2007/0252132 A1* | 11/2007 | Kamins et al. .................. 257/13 |
| 2007/0257246 A1 | 11/2007 | Bakkers et al. |
| 2007/0269924 A1 | 11/2007 | Gomez et al. |
| 2008/0093693 A1 | 4/2008 | Kamins et al. |
| 2008/0191317 A1* | 8/2008 | Cohen et al. .................. 257/618 |
| 2008/0192786 A1 | 8/2008 | Bakkers et al. |
| 2008/0218740 A1* | 9/2008 | Williams et al. ................ 356/72 |
| 2008/0241755 A1* | 10/2008 | Franklin et al. ............... 430/296 |
| 2009/0093131 A1* | 4/2009 | Lu et al. ........................ 438/778 |
| 2009/0148095 A1* | 6/2009 | Pesetski et al. .................... 385/3 |
| 2009/0173931 A1* | 7/2009 | Stumbo ........................... 257/14 |
| 2009/0189145 A1* | 7/2009 | Wang et al. ..................... 257/14 |
| 2009/0233240 A1* | 9/2009 | Baik et al. ..................... 430/312 |
| 2010/0264033 A1* | 10/2010 | Kruglick ......................... 205/80 |
| 2011/0023948 A1* | 2/2011 | Wang et al. ................... 136/255 |

OTHER PUBLICATIONS

Islam, M.S. et al., "A Novel Interconnection Technique for Manufacturing Nanowire Devices", Appl. Phys., Mar. 2005.

Islam, M.S. et al., "Ultrahigh-Density Silicon Nanobridges Formed Between Two Vertical Silicon Surfaces", IOP Publishing Ltd, Jan. 2004.

Li, Z. et al., Sequence-Specific Label-Free DNA Sensors Based on Silicon Nanowires, Nano Letters, vol. 4, p. 245-247, Jan. 2004.

Quitoriano, N. J. et al., "Guiding vapor-liquid-solid nanowire growth using SiO2", Nanotechnology, vol. 20, Issue 14, Apr. 8, 2009.

* cited by examiner

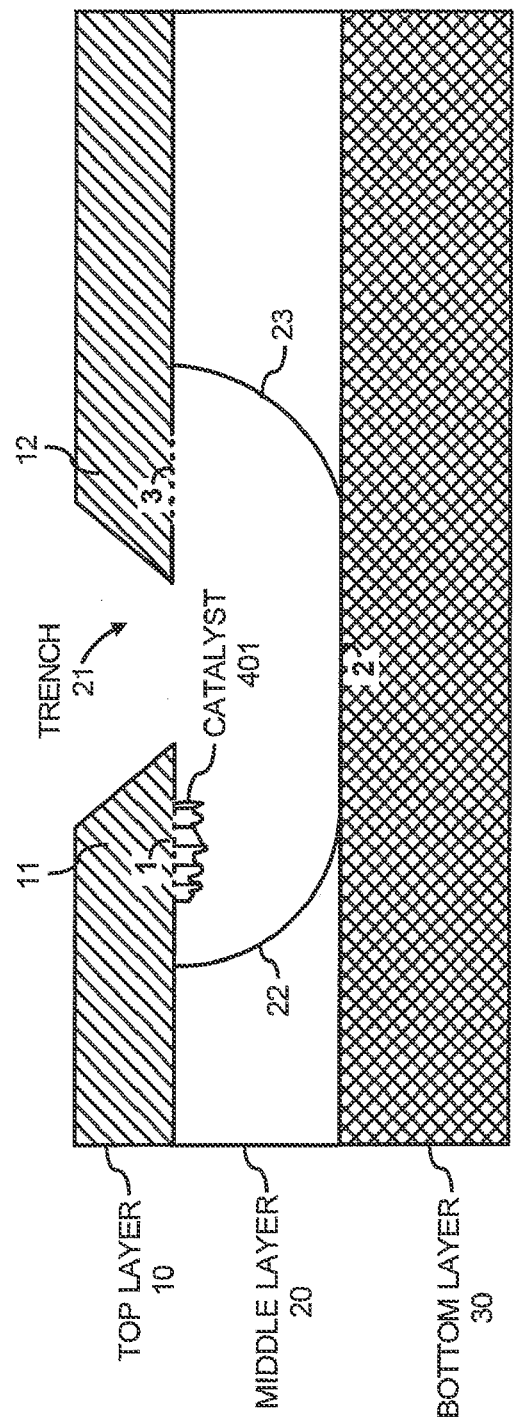

NANOWIRE SENSOR WITH ANGLED SEGMENTS THAT ARE DIFFERENTLY FUNCTIONALIZED

BACKGROUND

Semiconducting nanowires have been proposed as the basis for fabricating nanometer-scale electronic, optical, and sensing devices. Despite the promising properties of semiconducting nanowires, difficulty controlling their location and integrating them in a device prevents their widespread use. Most research has focused on growing the nanowires on one substrate, removing them, then placing them on another substrate to connect them to electrodes. However, it is difficult to properly position the nanowires on the substrate.

Furthermore, conventional nanowire devices, including nanowire sensors, mostly consist of a single undifferentiated segment. For example, a nanowire sensor may be functionalized, for example, by applying a coating, so the nanowire interacts with a particular species to detect the species. Many of these types of sensors are limited in that they are functionalized to only detect one species or a class of species, and as a result their ability to be used for other functions or as other types of devices is limited.

BRIEF DESCRIPTION OF THE DRAWINGS

The embodiments of the invention will be described in detail in the following description with reference to the following figures.

FIGS. 4A-C illustrate growing a nanowire, according to an embodiment.

DETAILED DESCRIPTION

Figure 1A:
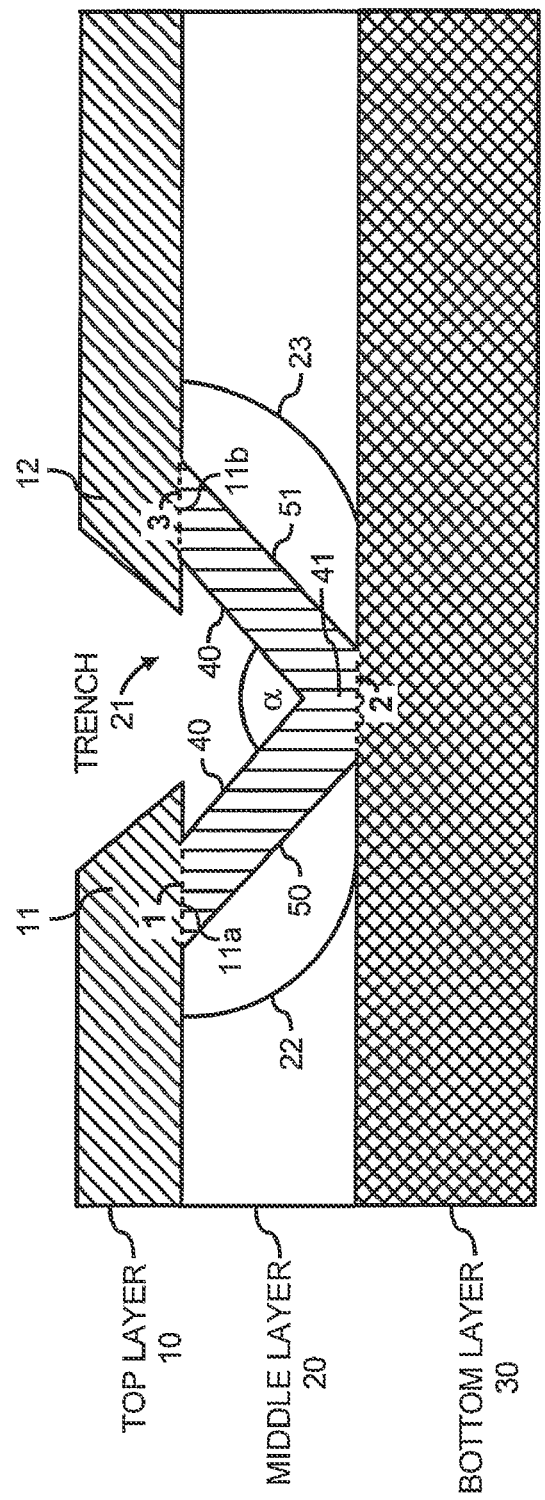
FIGS. 1A-B illustrate structures of a nanowire device, according to an embodiment.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures are not described in detail so as not to unnecessarily obscure the description of the embodiments. Also, the invention is described with respect to multiple embodiments. At least some of the embodiments may be practiced in combination.

According to an embodiment, a nanowire device includes at least one nanowire having differently functionalized segments. In one embodiment, the nanowire is a kinked nanowire grown from a single catalyst, and the segments, which are divided by the kinked region of the nanowire, are provided at a non-linear angle with respect to each other. The non-linear angle means an angle other than 0 or 180 degrees and may include an angle between 0 and 180 degrees or between 90 and 180 degrees. The differently functionalized segments are delineated segments of the nanowire, which are configured to interact with different species or class of different species. The functionalized segments and the kinked nanowire are described in further detail below.

A species refers to any organic or inorganic material, including any, atom, molecule, ion, element, compound, DNA strand, virus, bacterium, etc., or any moiety thereof. As used herein, the term species may also include a class of species. A class of species refers to any conglomerate of different species that have a common characteristic. A common characteristic may be a molecule that is common to all the species in the class. A group of carcinogenic molecules may be in one class of species. The differently functionalized segments may be configured to detect different species that are in the same class or not in the same class.

Interact, as used herein, refers to any association between a functionalized segment of a nanowire and a species that results in a modulation in the conductance of the differently functionalized segment. Conductance refers to the ability of an electric current to flow along a path, which is the reciprocal of resistance, and modulation in conductance refers to any change in conductance. For example, modulation in conductance may refer to a transition of conductance between two states. That is, a functionalized segment may transition from a non-conductive state to a conductive state, or vice versa. A non-conductive state generally means that no current is flowing through the nanowire, however, a non-conductive state may include a minor amount of current flow, which is negligible or a substantially different amount when compared to the current flow when the functionalized segment is in the conductive state. For example, a few picoamps may be flowing in the segment in a non-conductive state and 1 or more microamps may be flowing in the segment in a conductive state. However, the amount of current flowing in each state is largely dependent on the configuration of the nanowire, such as the length, diameter, thickness, width, materials used to compose the nanowire, etc. In another example, the modulation in conductance may refer to a transition between two conducting states with difference values of conductance.

In one embodiment, the modulation in conductance of a functionalized segment may be attributed to a charge carried by a species. Therefore, when the species interacts with the functionalized segment, the charge carried by the species induces a modulation in the conductance (e.g., from conductive to non-conductive or vice versa or between two different conductive states) of the functionalized segment. In another embodiment, the species interacts with the functionalized segment to allow the charge in the layer of the differently functionalized segment to move closer to the surface of the inner portion of the differently functionalized segment to, thereby, induce a modulation in the conductance of the functionalized segment. In yet another example, the species to be detected interacts by attacking a bond in the functionalized segment. Once that bond is broken, charge can be removed thus changing the conductance. A species may modulate the conductance of a functionalized segment in other manners, as described in greater detail below. Note that the conductance change induces a change in a current caused to flow by a voltage source between two electrodes.

As described above, interact refers to any association between a functionalized segment of a nanowire and a species that results in a modulation in the conductance of the functionalized segment. An association between a functionalized segment and a species refers to a physical proximity between the functionalized segment and the species. For example, a species may associate with a functionalized segment by absorbing, attaching, or binding to the functionalized segment. This physical proximity between the functionalized segment and the species may be influenced by a property of the species. A property of a species is a characteristic of the species that tends to provide an attraction of the species to another material, such as the material in the functionalized segment. The attraction may be the binding, absorbing or attaching to the functionalized segment. The strength of the attraction may also be a factor. For example, a strong binding may be needed to cause a change in conductance for a segment. The property of the species facilitates the association of the species to the interactive segment. A property of a species may include a characteristic, such as the number of valance electrons of a species, which allows the species to form ionic bonds, hydrogen bonds, dipole-dipole bonds, Van der Walls force interactions, aromatic bonds, covalent bonds, metallic bonds, etc. Therefore, if a property of a species allows the species to associate with the functionalized segment, such as by binding, the species may modulate the conductance of the functionalized segment. Conversely, if a species lacks a property that would allow the species to associate with a functionalized segment, then that species will not interact with the functionalized segment; e.g., will not modulate the conductance of the functionalized segment.

According to an embodiment, the nanowires described herein may have a plurality of differently functionalized segments. Differently functionalized segments means that a plurality of differently functionalized segments of a nanowire are different from each other, yet specifically configured to interact with one or more species, which may cause the modulation of the conductance of the segment. Each differently functionalized segment may be configured to detect different species or different properties of a species.

A nanowire segment is functionalized, for example, by applying a coating to the segment, doping the segment, forming the segment with a different composition, or a combination of any of these manners. With regard to doping, doping of the nanowire or one or more of its segments refers to the process of introducing any impurity atoms or particles into a base material. Dopants may be added during growth by introducing a gas containing the desired dopant atoms, or segments may be doped after deposition, most readily from a gaseous source containing the dopant atoms or by diffusion from a doped oxide, or possibly by ion implantation. Also, certain segments or regions of the nanowire may be doped to create a transistor as further described below, Forming and doping nanowires is generally known in the art and described, for example, in U.S. Pat. No. 7,087,920 filed Jan. 21, 2005, to Kamins, which is hereby incorporated herein by reference in its entirety.

Coating refers to the process of covering exterior portions of a substance with another substance, such as covering a segment of the nanowire with a material. Any material known in the art may be used to functionalize segments to allow the segments to interact with a particular species, including organic, inorganic, ligands, chemical, and biological materials. With regard to functionalizing, segments of the nanowire may be functionalized by, for example, adding a particular probe DNA/PNA to the nanowire, which binds the complementary DNA and does not significantly bind non-complementary DNA strands. DNA binding has been described by Li et al in "Sequence-specific label-free DNA sensors based on silicon nanowires," Nano Letters, Vol. 4, pp. 245-247 (2004), which is hereby incorporated by reference herein in its entirety. Functionalizing may also include coating.

In one embodiment, each segment of a nanowire is differently functionalized by individually heating each segment. Electrical connections are provided at endpoints of each segment. Each segment is individually heated, for example, by applying a current through the connections, and then the segment is functionalized, for example, by applying a coating to the heated segment. This process is further described with respect to FIG. 2.

As indicated above, the nanowire is a kinked nanowire grown from a single catalyst, and the segments, which are divided by the kinked region of the nanowire, are provided at a non-linear angle with respect to each other. The kinking of the nanowire may be caused by the renucleation of the nanowire or other mechanisms when it contacts a second layer during its growth after initially being grown from a first layer. Also, the direction of growth of the nanowire from the second layer may be influenced by a variety of factors.

The term nanowire, as used herein, refers to a nanostructure characterized by at least one and preferably at least two physical dimensions that are less than about 500 nanometers (nm), or about 200 nm, or about 150 nm, or about 100 nm, or about 50 nm, or about 25 nm or even less than about 10 nm or 5 nm. Nanowires typically have one principle axis that is longer than the other two principle axes and consequently have an aspect ratio greater than one. The longer axis is referred to as the length. In an embodiment, the nanowire may have an aspect ratio greater than about 10, greater than about 20, or greater than about 100, 200, or 500.

A nanowire in the nanowire sensor may have any length. In certain embodiments, a nanowire may range in length from about 10 nm to about 150 micrometers ($\mu$m). In an embodiment, the length of the nanowires may range from more than about 500 nm to less than about 100 $\mu$m, or from about 1 $\mu$m to less than about 80 $\mu$m.

The nanowire may have any diameter and will typically have diameters ranging from 5 to 200 nm. Although precise uniformity of the diameter of the nanowire is not required, in certain embodiments, the nanowire may have a substantially uniform diameter along its length, such that essentially no substantial tapering or change of the diameter occurs along the length of the nanowire.

The length/diameter ratio of the nanowire may be set to avoid fringing fields. For example, a charge carried by a species may produce an electromagnetic field extending from the species. This species may associate with a differently functionalized segment and the electromagnetic field of the species may interact and modulate the conductance of the differently functionalized segment. The length of the nanowire and subsequently the lengths of the differently functionalized segments of the nanowire may be increased to reduce unwanted interaction between the electromagnetic field of the species and an adjacent differently functionalized segment disposed along the length of the nanowire.

The nanowire may be made from materials known to be used in the composition of nanowires. In certain embodiments, the nanowire may be substantially crystalline and/or substantially non-crystalline. The nanowire may be substantially homogeneous in material, or in certain embodiments heterogeneous. That is, the nanowire may be fabricated from a single material or from a combination of materials. Essentially, any reasonably suitable material or materials may be used to form the nanowire. Examples of suitable materials include semiconductor materials such as, Si, Ge, InP, GaAs, GaN, GaP, InAs, and/or an appropriate combination of two or more such semiconductors, such as InGaAs.

The nanowire may be grown by methods known in the art. For example, a vapor-liquid-solid (VLS) mechanism may be used to grow the nanowires, such as described in Quitoriano et al., "Guiding vapor-liquid-solid nanowire growth using SiO2", Nanotechnology, Volume 20, Issue 14, pp. 145303 (Apr. 8, 2009), which is incorporated by reference in its entirety.

FIG. 1A illustrates a structure of a nanowire device including a nanowire having different functionalized segments, according to an embodiment. The device may be a sensor, a sensor that operates as a logic gate, referred to as a nanowire sensor logic device, a transistor, or another device. The structure of these devices is shown in FIG. 1 and includes a top layer 10, a middle layer 20, and a bottom layer 30. For example, the top and bottom layers 10 and 30 are silicon layers, and the middle layer 20 is a silicon oxide layer, such as $SiO_2$. The bottom layer 30 may be a silicon substrate, such as a handle wafer of an SOI substrate, or an electrically isolated region of a substrate, and the top layer 10 may be a silicon device layer.

An open trench 21 is formed in the middle layer 20, and the trench boundaries are shown as 22 and 23. The top layer 10 may be etched to form two electrically isolated sections 11 and 12, and between the isolated sections 11 and 12 is the open trench.

A nanowire 40 is grown in the trench 21 from a single catalyst. The nanowire 40 is grown from a bottom surface 11a of the section 11 of the top layer 10 towards the bottom layer 30. During the growth process, which is described in detail with respect to FIGS. 4A-C, the nanowire 40 contacts the bottom layer 30, kinks, and continues its growth towards the top layer 10. The direction of the nanowire growth is controlled to cause the nanowire 40 to grow towards the top layer 10. As shown, the nanowire 40 contacts a bottom surface 11b of the section 12 of the top layer 10. At the bottom layer 30, the nanowire 40 kinks to change its growth direction. The kink is shown as 41.

The nanowire 40 includes sections 50 and 51, which are functionalized, for example, by coating, doping, using different compositions, etc. The segment 50 is before the kink 41, and the segment 51 is after the kink 41.

The segments 50 and 51 are non-linearly angled with respect to each other. The angle between the segments is shown as α. A non-linear angle between the segments 50 and 51 means the angle α is not 0 or 180 degrees. The angle α may be between 0 and 180 degrees or between 90 and 180 degrees, so the nanowire 40 has a contact point 3 on the top layer 10 that is away from and can be electrically isolated from a starting growth point 1 of the nanowire 40. The sections 11 and 12 of the top layer 10 may be electrically isolated if needed for the nanowire device. The points where the nanowire 40 contacts the layers are shown as 1-3.

Figure 1B:
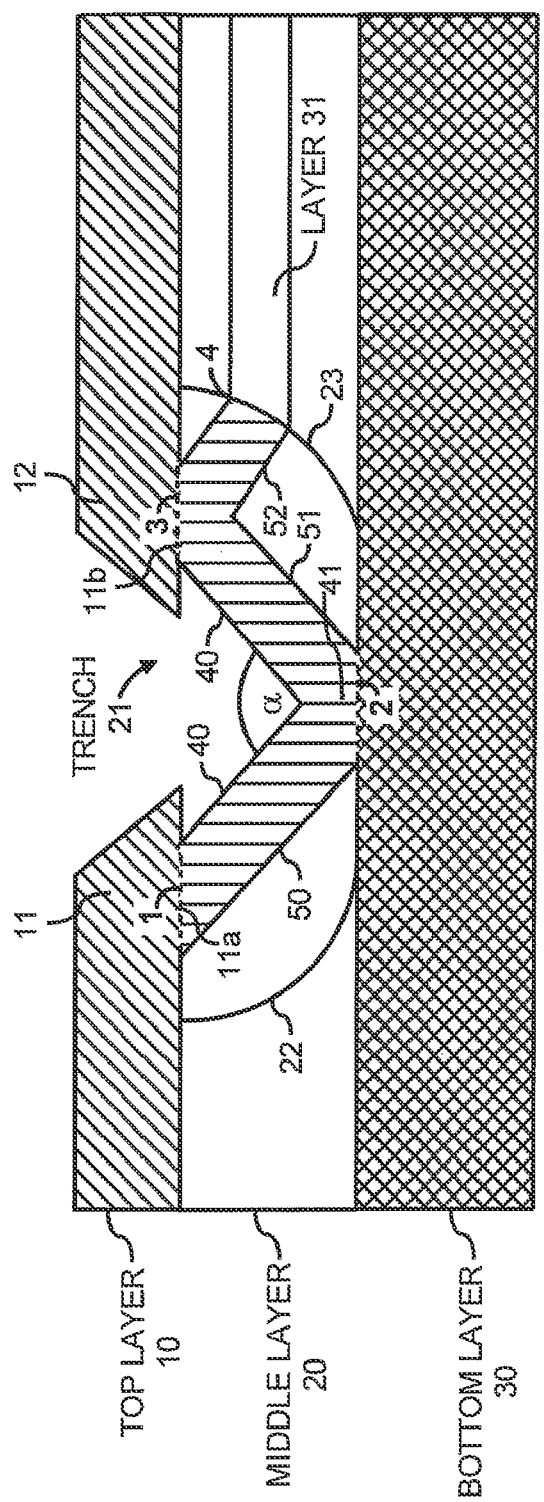

FIG. 1A shows the angle α of approximately 110 degrees by way of example. Other angles may be used, and also the nanowire 40 may be extended back towards the bottom layer 30 or towards another layer, such as shown in FIG. 1B. Also, the structure may include multiple nanowires.

The segments 50 and 51 may be symmetric. Symmetry may be in terms of the angle α. For example, if the angle α is 110 degrees, and each of the segments 50 and 51 is 55 degrees from the center of the angle α, then the segments may be considered symmetric. Other factors may also be considered, such as the diameter of each segment.

FIG. 1B shows that the nanowire 40 may include more than two segments. In this embodiment, the nanowire 40 includes a third segment 52 and a connection point 4, which may be to another layer 31.

Also, although not shown, multiple nanowires may be provided between layers. For example, multiple trenches may be created between the layers 10 and 30 and a nanowire with multiple segments is provided in each layer. Thus, multiple devices may be formed between the layers, and each device includes at least one nanowire.

Figure 2:
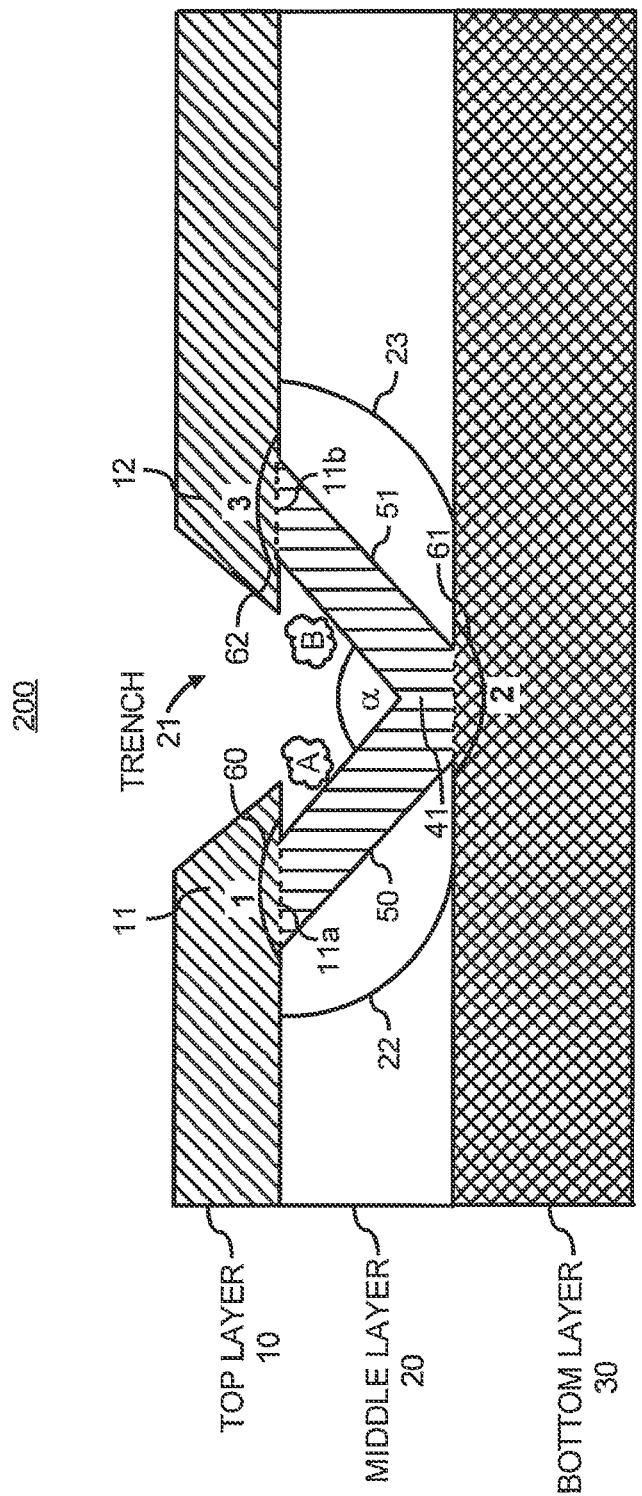
FIG. 2 illustrates a nanowire sensor logic device, according to an embodiment.

FIG. 2 illustrates a nanowire sensor logic device 200, according to an embodiment. The nanowire sensor logic device 200 uses the structure of FIG. 1A. The nanowire sensor logic device 200 includes the segments 50 and 51 that are differently functionalized so the device 200 operates as a logic gate.

The connection points 1-3 are electrical connections for the nanowire 40. For example, electrodes 60-62 may be provided at each of the connection points 1-3, and the electrodes 60-62 may be connected to a meter or other circuits to detect a change in conductance in one or more segments of the nanowire 40 and/or to apply a voltage or current to the segments.

The nanowire 40 may be a semiconducting nanowire, and, in this example, has three terminals, which are the connection points 1-3. The nanowire 40 may have more than three terminals and more than two segments. The segments 50 and 51 are differently functionalized to enable a sensor logic device. For example, the segment 50 between connections 1 and 2 is functionalized to react with species A, and the segment 51 between connections 2 and 3 is functionalized to react with species B. Each of the segments 50 and 51 is initially non-conducting; for example, because the semiconductor is fully depleted. Once segment 50 interacts with species A, segment 50 conducts between connections 1 and 2, for example, because the charge induced by the attached species or a surface reaction reduces the extent of a depletion region so that a conducting channel exists in this segment of the nanowire 40.

Similarly once segment 51 interacts with species B, that segment can conduct. If the nanowire 40 is exposed to both species A and B, then a conduction path between connections 1 and 3 is enabled. However, if the segments are exposed to only one of A or B or to neither A nor B, then the nanowire will not conduct, thus enabling an AND sensor logic device. A meter may be connected to the electrodes 60 and 62 to detect the change in conductance.

In another example, the nanowire sensor logic device 200 operates as an NOR gate. Initially both segments 50 and 51 are conducting. Exposing the nanowire sensor logic device 200 to species A turns off segment 50, which stops current flow through the nanowire 40. Exposing the nanowire sensor logic device 200 to species B turns off segment 51, again stopping current flow through the nanowire 40. Thus exposing the nanowire to either A or B changes the conducting state of the nanowire. This also applies to changes in conductance between two conducting states, and not just switching between ON and OFF states. It will be apparent to one of ordinary skill in the art that the nanowire sensor logic device 200 can be arranged to operate as other types of logic gates, such as NAND, OR, NOT or an XOR gate. Also, the change in conductance for a segment may be from conducting to non-conducting or vice versa depending on how the device is designed.

The embodiments describe the nanowire segments as being in essentially two states, conducting or non-conducting. That is, current can either flow or cannot. However, a person having ordinary skill in the art will appreciate that the nanowire may have different levels of conductance, which may be measured by a meter, and different levels may be indicative of conductive states.

According to an embodiment, the functionalized segments may be created during a functionalization process by heating each segment individually. For example, segment 50 may be heated by applying a current through connection points 1 and 2. Then, a coating material may be applied to the structure and will interact with only the heated segment 51 to form the functional coating on only that segment. Subsequently, segment 51 may be heated by applying a current through connection points 2 and 3, and then that segment is functionalized. Other techniques may also be used to create the different functionalized segments individually.

Figure 3:
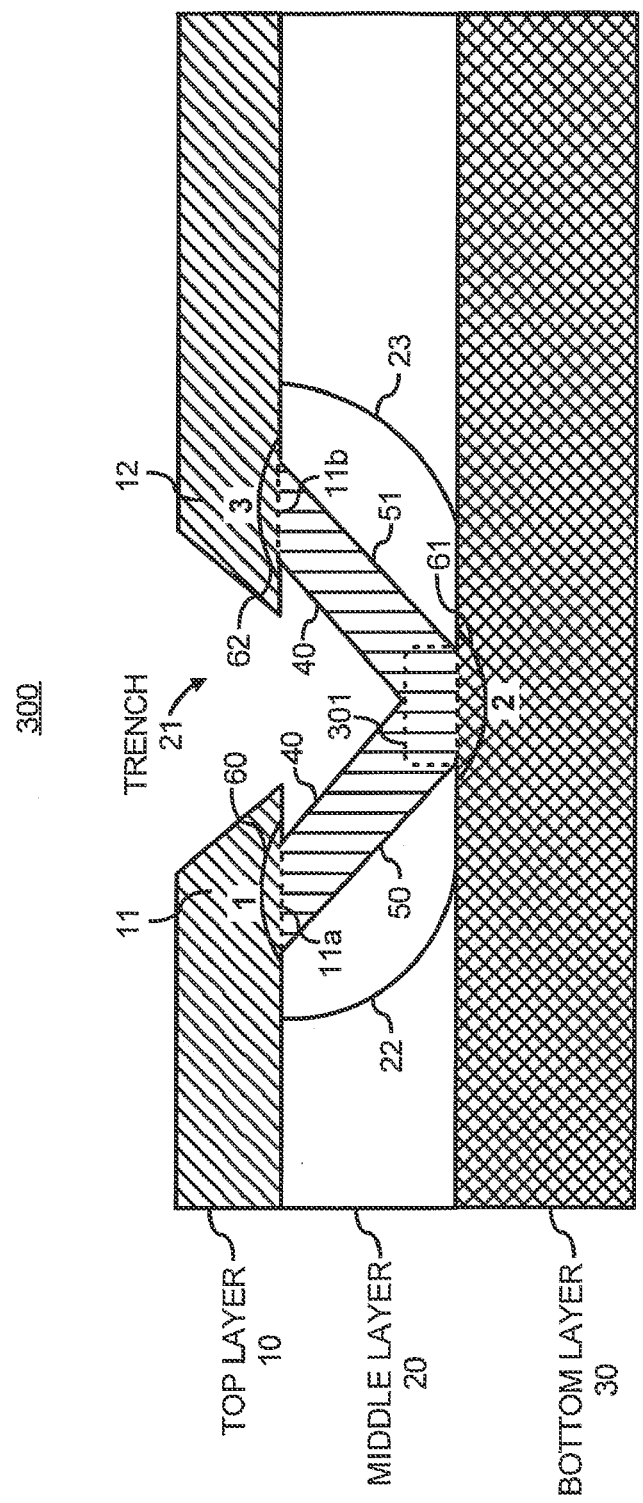
FIG. 3 illustrates a nanowire transistor, according to an embodiment.

FIG. 3 shows the nanowire device as a transistor 300, according to an embodiment. The transistor 300 may have the structure shown in FIG. 1, In one embodiment, a central region, shown as 301, near connection 2 is doped oppositely from that in the majority of the nanowire, forming an n-p-n or p-n-p bipolar junction transistor (BJT) with the base being the connection 2 at the underlying Si substrate. The bottom layer 30 exposed in the trench 21 may be isolated from other transistors formed on the same substrate, so that the base connections of different transistors are isolated from each other. The need for this isolation depends on the circuitry to be formed.

Figure 4B:
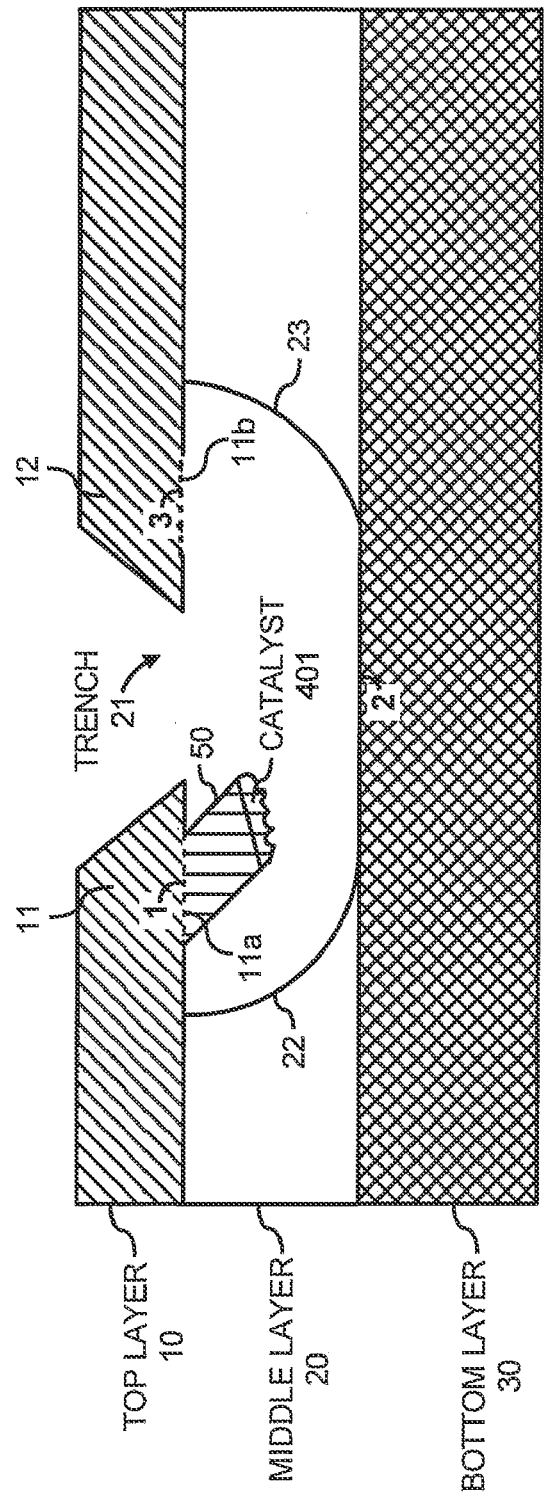
Figure 4C:
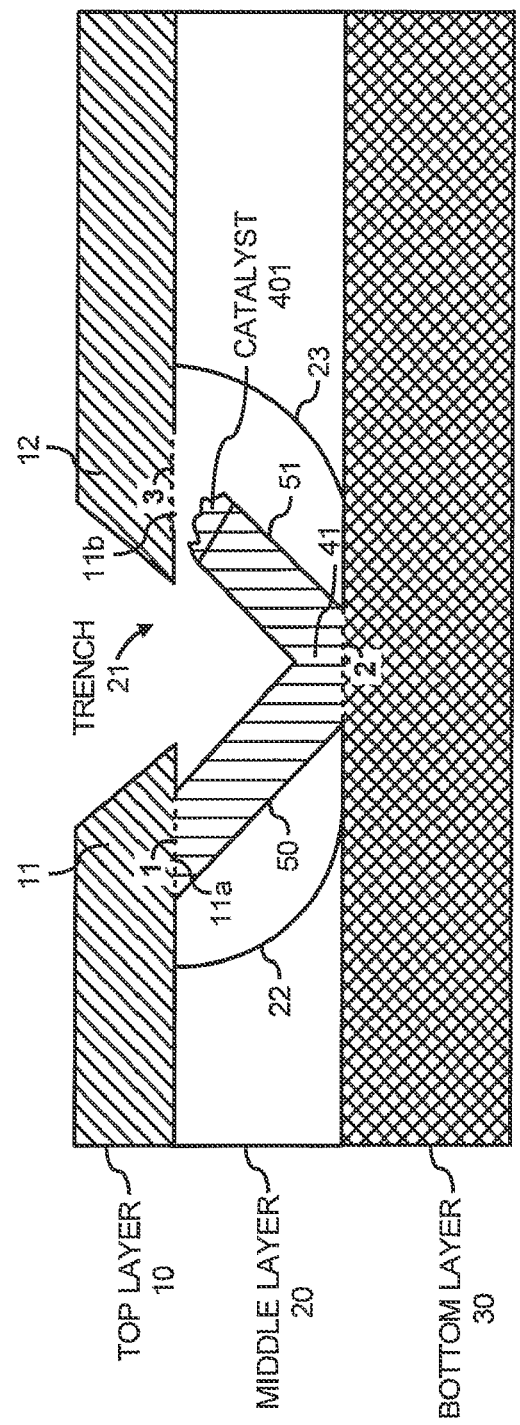

FIGS. 4A-C show the process of growing the nanowire 40, according to an embodiment. FIG. 4A shows a catalyst 401 applied to the bottom surface 11a in the trench 21. The trench 21 may be formed by etching the central portion of the top layer 10 and a portion of the middle layer 20. A mask may be used for the etching.

The catalyst 401 may be a metal, such as Au, that forms a liquid eutectic with Si during nanowire growth, or another metal, such as Ti, Al, In, Sn, Pt, Ga, and Fe, may be used for the nanowire growth. The nanowire 40 may be grown using VLS or another known synthesis technique. The nanowire 40 is grown from the bottom surface 112 towards the bottom layer 30. As shown in FIG. 4B, the segment 50 starts to form as the nanowire 40 is grown.

The nanowire 40 eventually contacts the bottom layer 30, and continues its growth towards the top layer 10. The direction of the nanowire growth is controlled to cause the nanowire 40 to grow towards the top layer 10, such as shown in FIG. 4C. The nanowire 40 contacts the bottom surface 11b of the section 12 of the top layer 10 to form the second segment 51, as shown in FIG. 1. Note that at the bottom layer 30, the nanowire 40 kinks, e.g., renucleates, to change its growth direction towards the surface 11b. The kink is shown as 41. The direction of the growth of the nanowire is controlled through crystallographic orientation and/or other factors. The growing of the nanowire is described in Quitoriano et al., "Guiding vapor-liquid-solid nanowire growth using SiO2", incorporated by reference above.

While the embodiments have been described with reference to examples, those skilled in the art will be able to make various modifications to the described embodiments. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A nanowire device comprising:
   at least one nanowire having a plurality of differently functionalized segments, wherein each of the segments has a conductance that modulates based on interaction with at least one species, wherein
   the segments include a first segment at a non-linear angle from a second segment, and
   the at least one species comprises a first species and a second different species, and the first segment is to change its conductive state by interacting with the first species, and the second segment is to change its conductive state by interacting with the second species.

2. The nanowire device of claim 1, wherein the at least one nanowire comprises a kink and the kink forms the non-linear angle between the first segment and the second segment.

3. The nanowire device of claim 2, further comprising:
   a first layer including electrically isolated regions; and
   a second layer,
   wherein the first segment is before the kink and is between the first layer and the second layer and the second segment is after the kink and between the second layer and the first layer.

4. The nanowire device of claim 3, wherein a first electrode and a third electrode are on the first layer and a second electrode is on the second layer, and the first segment is connected between the first and second electrodes and the second segment is connected between the second and third electrodes.

5. The nanowire device of claim 3, wherein the first and second segments are symmetric.

6. The nanowire device of claim 1, wherein the first segment and the second segment are to interact with the at least one species by changing a conductive state of the first and second segments.

7. The nanowire device of claim 1, further comprising a sensor logic gate, and the sensor logic gate operates as a logic gate based on the interaction of the first and second segments with the first and second species, respectively.

8. The nanowire device of claim 7, wherein the sensor logic gate comprises one of a NAND, AND, NOR, OR, NOT, and XOR gate.

9. The nanowire device of claim 1, further comprising a transistor, and a region of the at least one nanowire near an angled junction of the first and second segments is oppositely doped from another region in the at least one nanowire.

10. The nanowire device of claim 1, wherein each segment is heated in the presence of a coating material to functionalize the segment.

11. The nanowire device of claim 10, wherein each segment bridges electrodes formed on layers in the nanowire device, and each segment is heated by applying a current using the bridged electrodes.

12. The nanowire device of claim 1, further comprising:
   a top silicon layer including electrically isolated regions;
   a middle silicon oxide layer;
   a bottom silicon layer; and
   a trench in the middle silicon oxide layer, wherein the first segment is grown at a first angle in the trench from the top silicon layer to the bottom silicon layer, and the second segment is grown at a second angle in the trench from the bottom silicon layer to the top silicon layer.

13. The nanowire device of claim 12, wherein the trench comprises over-hangs comprised of non-connected sections of the top layer, and the first segment is grown from a bottom surface of a first of the overhangs, and the second segment is grown to a bottom surface of a second of the overhangs.

14. The nanowire device of claim 13, further comprising a plurality of transistors, and a base connection of each transistor is formed on the bottom silicon layer and the base connections are isolated from each other.

15. A nanowire sensor logic device comprising:
   at least one nanowire having a first functionalized segment configured to change its conductive state by interacting with a first species, and a second differently functionalized segment configured to change its conductive state by interacting with a second species different from the first species, and the segments interacting with the species simulate operation of a logic gate, wherein the at least one nanowire is grown from a single catalyst and the first segment is at a non-linear angle from the second segment.

16. The nanowire sensor logic device of claim 15, wherein the logic gate comprises one of a NAND, AND, NOR, OR, NOT, and XOR gate.

17. The nanowire device of claim 15, wherein each segment bridges electrodes, formed between layers in the nanowire sensor logic device, and each segment is heated by applying a current using the bridged electrodes to functionalize each segment.

18. A nanowire device comprising:
a top silicon layer;
a middle silicon oxide layer;
a bottom silicon layer;
a trench in the middle silicon oxide layer; and
at least one nanowire grown from a single catalyst and having a first segment and a second segment, wherein the first segment is grown at a first angle in the trench from the top silicon layer to the bottom silicon layer, and the second segment is grown at a second angle in the trench from the bottom silicon layer to the top silicon layer.

19. The nanowire device of claim 18, further comprising a transistor, and a region of the at least one nanowire near an angled junction of the first and second segments is oppositely doped from another region in the at least one nanowire.

* * * * *